(12) United States Patent
Li et al.

(10) Patent No.: US 12,238,986 B2
(45) Date of Patent: Feb. 25, 2025

(54) DISPLAY DEVICE, DISPLAY PANEL AND FABRICATION METHOD THEREOF

(71) Applicant: BOE TECHNOLOGY GROUP CO., LTD., Beijing (CN)

(72) Inventors: Yunlong Li, Beijing (CN); Pengcheng Lu, Beijing (CN); Longfei Fan, Beijing (CN); Dongsheng Li, Beijing (CN); Zhijian Zhu, Beijing (CN); Yuanlan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 553 days.

(21) Appl. No.: 17/441,738

(22) PCT Filed: Dec. 16, 2020

(86) PCT No.: PCT/CN2020/136961
§ 371 (c)(1),
(2) Date: Sep. 22, 2021

(87) PCT Pub. No.: WO2022/126450
PCT Pub. Date: Jun. 23, 2022

(65) Prior Publication Data
US 2022/0399426 A1    Dec. 15, 2022

(51) Int. Cl.
*H10K 59/131* (2023.01)
*H10K 59/122* (2023.01)
(Continued)

(52) U.S. Cl.
CPC ......... *H10K 59/131* (2023.02); *H10K 59/122* (2023.02); *H10K 59/38* (2023.02); *H10K 71/00* (2023.02); *H10K 59/1201* (2023.02)

(58) Field of Classification Search
CPC .... H10K 59/131; H10K 59/122; H10K 59/38; H10K 71/00; H10K 59/1201; H10K 59/873; H10K 59/879; H10K 59/35
See application file for complete search history.

(56) References Cited

U.S. PATENT DOCUMENTS 10,297,783 B2    5/2019   Sasaki
2005/0073228 A1*  4/2005  Tyan ................... H10K 50/125
                                                        313/504

(Continued)

FOREIGN PATENT DOCUMENTS

CN    106981584 A    7/2017
CN    107579093 A    1/2018
(Continued)

OTHER PUBLICATIONS

Written Opinion for International Application No. PCT/CN2020/136961 mailed Jun. 30, 2021.

*Primary Examiner* — Herve-Louis Y Assouman
(74) *Attorney, Agent, or Firm* — Perilla Knox & Hildebrandt LLP; Kenneth A. Knox

(57) ABSTRACT

This disclosure provides a display device, a display panel, and a fabrication method thereof. The display panel includes a driving backplane, a first electrode layer, a pixel definition layer, a light-emitting functional layer, and a second electrode layer. The first electrode layer is arranged on a side surface of the driving backplane and includes a first electrode and a transferring ring. The pixel definition layer covers the first electrode layer and the driving backplane. The light-emitting functional layer is arranged on a surface of the first electrode layer facing away from the driving backplane, and the light-emitting functional layer is in a range of a transferring area of the driving backplane. The second electrode layer covers the pixel definition layer and the light-emitting functional layer. A boundary of the second (Continued)

electrode layer is inside a boundary of the pixel definition layer and is connected with the transferring ring.

17 Claims, 9 Drawing Sheets

(51) Int. Cl.
   *H10K 59/35* (2023.01)
   *H10K 59/38* (2023.01)
   *H10K 59/80* (2023.01)
   *H10K 59/88* (2023.01)
   *H10K 71/00* (2023.01)
   *H10K 59/12* (2023.01)

(56) References Cited

U.S. PATENT DOCUMENTS

| | | |
|---|---|---|
| 2007/0099356 A1 | 5/2007 | Park et al. |
| 2013/0207899 A1 | 8/2013 | Wang et al. |
| 2016/0322427 A1 | 11/2016 | Cheon et al. |
| 2017/0222186 A1* | 8/2017 | Nozawa ................. H10K 50/81 |
| 2017/0229528 A1* | 8/2017 | Ota ..................... H10K 59/1213 |
| 2018/0061728 A1* | 3/2018 | Chen .................... H10K 50/844 |
| 2018/0123082 A1 | 5/2018 | Sasaki |
| 2019/0123279 A1* | 4/2019 | Kajimoto .............. C07C 211/43 |

FOREIGN PATENT DOCUMENTS

| | | |
|---|---|---|
| CN | 106981584 B | 11/2019 |
| CN | 110718641 A | 1/2020 |
| CN | 110752250 A | 2/2020 |
| CN | 110993814 A | 4/2020 |
| CN | 111415970 A | 7/2020 |
| CN | 111554718 A | 8/2020 |
| CN | 111864118 A | 10/2020 |
| CN | 112002831 A | 11/2020 |
| CN | 212277229 U | 1/2021 |
| KR | 100647711 B1 | 11/2006 |

* cited by examiner forming a first filter material layer capable of transmitting light of a first color on a surface of the planarization layer facing away from the driving backplane; the first filter material layer comprising a first filter portion and a first filter layer; an orthographic projection of the first filter portion on the driving backplane being within the pixel circuit area, and an orthographic projection of the first filter layer on the driving backplane covering the transferring area and extending into the peripheral area ⸺ S1710 forming a second filter material layer capable of transmitting light of a second color on the surface of the planarization layer facing away from the driving backplane and on a surface of the first filter layer facing away from the driving backplane; the second filter material layer comprising a second filter portion and a second filter layer, an orthographic projection of the second filter portion on the driving backplane being within the pixel circuit area, the second filter layer being arranged on the surface of the first filter layer facing away from the driving backplane, and an orthographic projection of the second filter layer on the driving backplane covering the transferring area and extending into the peripheral area ⸺ S1720

FIG. 7

DISPLAY DEVICE, DISPLAY PANEL AND FABRICATION METHOD THEREOF

CROSS-REFERENCE TO RELATED APPLICATION

This application is a national phase application under 35 U.S.C. 371 of International Application No. PCT/CN2020/136961 filed Dec. 16, 2020, the contents of which being incorporated by reference in their entirety herein.

TECHNICAL FIELD

The present disclosure relates to the technical field of display and, in particular, to a display device, a display panel, and a fabrication method of the display panel.

BACKGROUND

With the development of display technology, display panels have been widely used in various electronic devices, such as mobile phones, for realizing image display and touch operation. OLED (Organic Light-Emitting Diode) display panels are becoming more commonly used. At present, a packaging technology is generally used to avoid the erosion of a light-emitting device due to the external water vapor and oxygen, however, it is necessary to improve the effect of blocking water vapor and oxygen.

It should be noted that information disclosed in this part are provided only for acquiring a better understanding of the background of the present application and therefore may include information that is not current technology already known to those of ordinary skill in the art.

SUMMARY

An objective of the present disclosure is to provide a display device, a display panel, and a fabrication method of a display panel.

According to an aspect of the present disclosure, a display panel is provided. The display panel includes:
- a driving backplane having a pixel circuit area, a transferring area surrounding the pixel circuit area, and a peripheral area surrounding the transferring area;
- a first electrode layer arranged on a side surface of the driving backplane and including a first electrode and a transferring ring, the first electrode being located in the pixel circuit area, and the transferring ring being located in the transferring area and surrounding the pixel circuit area;
- a pixel definition layer covering the first electrode layer and the driving backplane, and exposing the first electrode and the transferring ring;
- a light-emitting functional layer arranged on a surface of the first electrode layer facing away from the driving backplane, an orthographic projection of the light-emitting functional layer on the driving backplane being within a range surrounded by the transferring area;
- a second electrode layer covering the pixel definition layer and the light-emitting functional layer; a boundary of the second electrode layer being located inside a boundary of the pixel definition layer, and the second electrode layer being connected with the transferring ring; the second electrode layer having an electrode edge portion, and the electrode edge portion being an annular area extending inward from the boundary of the second electrode layer; at least part of an orthographic projection of the electrode edge portion on the driving backplane being within the transferring area, and a thickness of the electrode edge portion decreasing towards a boundary of the driving backplane.

In an exemplary embodiment of the present disclosure, the display panel further includes:
- a light extraction layer covering the second electrode layer, a boundary of the light extraction layer being located inside the boundary of the pixel definition layer. The light extraction layer has an extraction edge portion covering the electrode edge portion, and the extraction edge portion is an annular area extending inward from the boundary of the light extraction layer. An orthographic projection of the extraction edge portion on the driving backplane is at least partially within the transferring area.

In an exemplary embodiment of the present disclosure, an orthographic projection of the transferring ring on the driving backplane at least partially coincides with the orthographic projection of the electrode edge portion on the driving backplane; the orthographic projection of the transferring ring on the driving backplane at least partially coincides with the orthographic projection of the extraction edge portion on the driving backplane.

In an exemplary embodiment of the present disclosure, a distance between the boundary of the light extraction layer and the boundary of the pixel definition layer is not less than 300 μm.

In an exemplary embodiment of the present disclosure, the display panel further includes:
- a color film layer arranged at a side of the light extraction layer facing away from the driving backplane. The color film layer includes a pixel area and an edge area surrounding the pixel area, an orthographic projection of the pixel area on the driving backplane is within the pixel circuit area, and an orthographic projection of the edge area on the driving backplane covers the transferring area and extends into the peripheral area. The edge area is a light shielding structure.

In an exemplary embodiment of the present disclosure, the edge area includes a first filter layer and a second filter layer which are sequentially laminated in a direction facing away from the driving backplane, the first filter layer is capable of transmitting light of a first color, and the second filter layer is capable of transmitting light of a second color; the first color and the second color are different.

In an exemplary embodiment of the present disclosure, a thickness of the edge area is greater than a thickness of the pixel area.

In an exemplary embodiment of the present disclosure, the first color is red and the second color is blue.

In an exemplary embodiment of the present disclosure, the display panel further includes:
- a transparent cover plate arranged at a side of the color film layer facing away from the driving backplane. A boundary of an orthographic projection of the transparent cover plate on the driving backplane coincides with the boundary of the driving backplane.

According to an aspect of the present disclosure, a fabrication method of a display panel is provided. The fabrication method includes:
- forming a driving backplane, the driving backplane having a pixel circuit area, a transferring area surrounding the pixel circuit area, and a peripheral area surrounding the transferring area;

forming a first electrode layer on a side surface of the driving backplane, the first electrode layer including a first electrode and a transferring ring, the first electrode being located in the pixel circuit area, and the transferring ring being located in the transferring area and surrounding the pixel circuit area;

forming a pixel definition layer covering the first electrode layer and the driving backplane, the pixel definition layer exposing the first electrode and the transferring ring;

forming a light-emitting functional layer at a side of the first electrode layer facing away from the driving backplane, an orthographic projection of the light-emitting functional layer on the driving backplane being within a range surrounded by the transferring area;

forming a second electrode layer covering the pixel definition layer and the light-emitting functional layer; a boundary of the second electrode layer being located inside a boundary of the pixel definition layer, and the second electrode layer being connected with the transferring ring; the second electrode layer having an electrode edge portion, and the electrode edge portion being an annular area extending inward from the boundary of the second electrode layer; at least part of an orthographic projection of the electrode edge portion on the driving backplane being within the transferring area, and a thickness of the electrode edge portion decreasing towards a boundary of the driving backplane.

In an exemplary embodiment of the present disclosure, the fabrication method further includes:

forming a light extraction layer covering the second electrode layer, a boundary of the light extraction layer being located inside the boundary of the pixel definition layer. The light extraction layer has an extraction edge portion covering the electrode edge portion, and the extraction edge portion is an annular area extending inward from the boundary of the light extraction layer. An orthographic projection of the extraction edge portion on the driving backplane is at least partially located in the transferring area.

In an exemplary embodiment of the present disclosure, the fabrication method further includes:

forming a color film layer at a side of the light extraction layer facing away from the driving backplane. The color film layer includes a pixel area and an edge area surrounding the pixel area, an orthographic projection of the pixel area on the driving backplane is located in the pixel circuit area, and an orthographic projection of the edge area on the driving backplane covers the transferring area and extends into the peripheral area. The edge area is a light shielding structure.

In an exemplary embodiment of the present disclosure, after forming the light extraction layer and before forming the color film layer, the fabrication method further includes:

forming a planarization layer at a side of the light extraction layer facing away from the driving backplane;

forming a color film layer at a side of the light extraction layer facing away from the driving backplane, including:

forming a first filter material layer capable of transmitting light of a first color on a surface of the planarization layer facing away from the driving backplane; the first filter material layer including a first filter portion and a first filter layer; an orthographic projection of the first filter portion on the driving backplane being within the pixel circuit area, and an orthographic projection of the first filter layer on the driving backplane covering the transferring area and extending into the peripheral area;

forming a second filter material layer capable of transmitting light of a second color on the surface of the planarization layer facing away from the driving backplane and a surface of the first filter layer facing away from the driving backplane; the second filter material layer including a second filter portion and a second filter layer, an orthographic projection of the second filter portion on the driving backplane being within the pixel circuit area, the second filter layer being arranged on the surface of the first filter layer facing away from the driving backplane, and an orthographic projection of the second filter layer on the driving backplane covering the transferring area and extending into the peripheral area;

the first color and the second color being different.

In an exemplary embodiment of the present disclosure, the fabrication method further includes:

forming a transparent cover plate at a side of the color film layer facing away from the driving backplane, a boundary of an orthographic projection of the transparent cover plate coincides with the boundary of the driving backplane.

According to an aspect of the present disclosure, a display device is provided. The display device includes the display panel according to any one of the above embodiments.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute part of this specification, illustrate embodiments consistent with the invention and, together with the description, serve to explain the principles of the invention. Understandably, the drawings in the following description are only for illustrating some embodiments of the present disclosure and those of ordinary skill in the art can also derive other drawings based on the drawings without paying any creative labor.

FIG. 7 is a flowchart of step S170 in the fabrication method according to an embodiment of the present disclosure.

DETAILED DESCRIPTION

Figure 1:
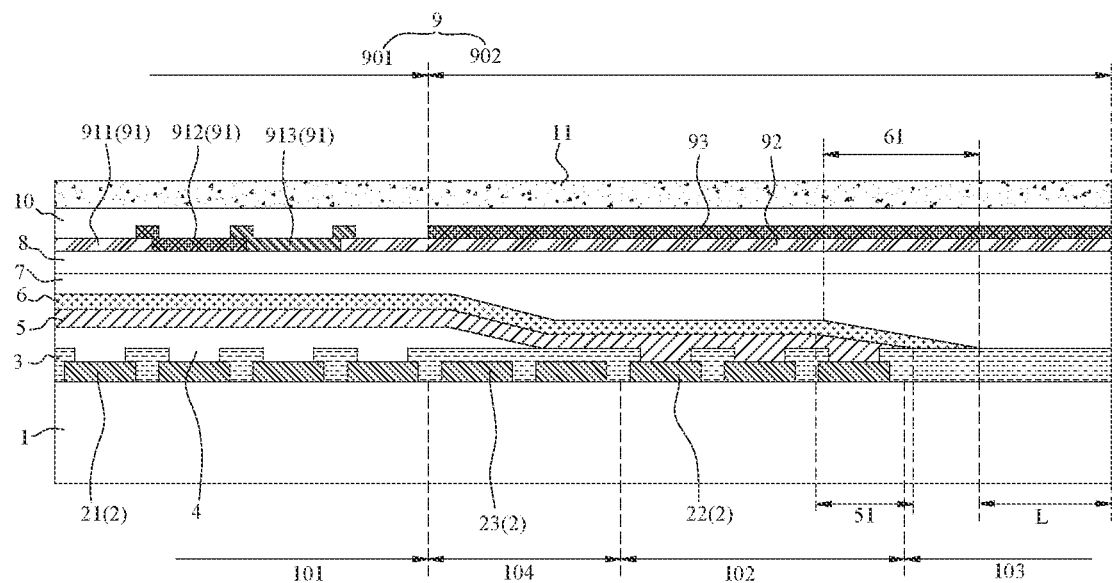
FIG. 1 is a schematic view of a display panel according to an embodiment of the present disclosure.

Exemplary embodiments will now be described more fully with reference to the accompanying drawings. However, the exemplary embodiments may be embodied in a variety of forms and should not be construed as being limited to the embodiments set forth herein. On the contrary, the embodiments are provided to make the present disclosure comprehensive and through and to fully convey the concept of the exemplary embodiments to those skilled in the art. The same reference signs in the drawings denote the same or similar structures, and detailed descriptions thereof will be omitted. In addition, the drawings are merely schematic illustrations of the present disclosure and are not necessarily drawn to scale.

Words such as "one", "an/a", "the", and "said" are used herein to indicate the presence of one or more elements/component parts/and others. Terms "including", and "having" have an inclusive meaning which means that there may be additional elements/component parts/and others in addition to the listed elements/component parts/and others. Terms "first" and "second" are used herein only as markers, and they do not limit the number of objects modified after them.

The reference numbers used in the figures are as follows: 1: driving backplane; 101: pixel circuit area; 102: transferring area; 103: peripheral area; 104: transition area; 2: first electrode layer; 21: first electrode; 22: transferring ring; 23: dummy electrode; 3: pixel definition layer; 4: light-emitting functional layer; 5: second electrode layer; 51: electrode edge portion; 6: light extraction layer; 61: extraction edge portion; 7: first packaging layer; 8: planarization layer; 9: color film layer; 901: pixel area; 902: edge area; 91: filter portion; 911: first filter portion; 912: second filter portion; 913: third filter portion; 92: first filter layer; 93: second filter layer; 10: second packaging layer; and 11: transparent cover plate.

In the related art, a Micro OLED (Micro Organic Light-emitting Diode) display panel is a display panel developed in recent years, and includes a Micro OLED light-emitting device usually having a size less than 100 μm. A silicon-based OLED display panel is more commonly used. The silicon-based OLED can not only realize an active addressing of a pixel, but also realize preparation of complementary metal-oxide-semiconductor (CMOS) circuits including a pixel circuit, a timing control (TCON) circuit, an over-current protection (OCP) circuit or the like on the silicon-based substrate, thereby facilitating to reduce system volume and realizing light weight.

Taking a silicon-based OLED display panel as an example, the display panel may be divided into a display area, a transition area surrounding the display area, and a peripheral area surrounding the transition area. Meanwhile, the display panel may include a driving backplane, a light-emitting device layer, a light extraction layer, and a packaging layer. The light-emitting device layer is arranged at a side of the driving backplane and includes a plurality of light-emitting devices located in the display area. The light-emitting devices may be OLED light-emitting devices, and each of the light-emitting devices includes a first electrode (anode), a light-emitting functional layer, and a second electrode (cathode) which are sequentially laminated in a direction facing away from the driving backplane. The light-emitting functional layer may be driven to emit light by applying electrical signals to the first electrode and the second electrode. The specific light-emitting principle of the OLED light-emitting device will not be descried in detail herein.

The light extraction layer covers the light-emitting device layer for increasing the light output. The packaging layer covers the light extraction layer.

When the light-emitting device is formed, Fine Metal Mask (FMM) may be used to evaporate the light-emitting functional layer of each of the light-emitting devices. However, FMM has a limited precision and cannot achieve high-resolution display. Therefore, a full-color display can be realized by the way of combining a light-emitting functional layer for emitting white light or monochromatic light with a color film layer. In this process, all the light-emitting devices share the same one light-emitting functional layer and the same one second electrode, while the first electrodes of all the light-emitting devices are independent with each other and are distributed in an array so as to be driven separately. The color film layer is located at a side of the packaging layer facing away from the driving backplane, and includes a plurality of filtering areas corresponding to the light-emitting devices one by one. The lights emitted by the light-emitting devices cooperate with the filter effect of the corresponding filtering areas, so that each of the filtering areas may emit light with a specified color, and an orthographic projection of the color film layer on the driving backplane is located in a range surrounded by the peripheral area.

In addition, the display panel may also include a transferring ring (which may also be referred to as a cathode ring) arranged in the same layer as the first electrode, and the transferring ring is located in the transferring area and surrounds outside the display area. The transferring ring is not connected with the first electrode, but connected with the second electrode, so that the second electrode is connected with the driving circuit in the driving backplane through the transferring ring.

The color film layer may also be provided with a transparent cover plate at a side thereof facing away from the driving backplane, however, in order to facilitate the alignment of the mask, a reflective alignment mark may be provided. The alignment mark may be arranged on the same layer as the first electrode, the second electrode, or the conductive layer in the driving backplane, and be located in the peripheral area. In order to prevent the transparent cover plate from blocking the alignment mark, the alignment mark is located outside a range covered by the transparent cover plate and the color film layer, so that there is a distance between a boundary of an orthographic projection of the transparent cover plate on the driving backplane and a boundary of the driving backplane, affecting the protection effect of the transparent cover plate.

It has been found that, when the second electrode and the light extraction layer are formed by the mask process, the second electrode layer and the light extraction layer have shadow areas at an edge thereof since there is a shadowing effect of the mask when a pattern is formed thereon, and the shadow areas are located outside the transition area and in the peripheral area, such that a distance between boundaries of the second electrode layer and the light extraction layer and the boundary of the driving backplane is smaller, which is usually about 100 μm. Thus, a path for the external water vapor and oxygen invading the display panel is shorter, so that it is easy to cause invasion of water vapor and oxygen, possibly cause corrosion of the second electrode, and possibly cause film burst after the light extraction layer absorbs water vapor. In addition, since the second electrode and the light extraction layer are closer to the edge of the driving backplane, a bonding surface between the edge of the packaging layer and the driving backplane is smaller, which is prone to peeling off and affects the packaging effect.

An embodiment of the present disclosure provides a display panel. The display panel may be an OLED display panel, and in the embodiment of the present disclosure, a silicon-based OLED display panel is taken as an example to illustrate.

Figure 2:
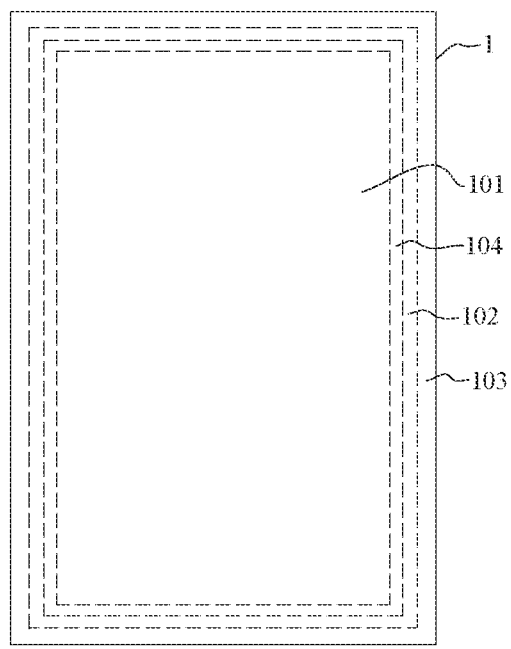
FIG. 2 is a top view of a driving backplane according to an embodiment of a display panel of the present disclosure.

As shown in FIGS. 1 and 2, the display panel of the present disclosure may include a driving layer 1, a first electrode layer 2, a pixel definition layer 3, a light-emitting functional layer 4, and a second electrode layer 5.

The driving backplane 1 has a pixel circuit area 101, a transferring area 102 surrounding the pixel circuit area 101, and a peripheral area 103 surrounding the transferring area 102.

The first electrode layer 2 is arranged on a side surface of the driving backplane 1 and includes a first electrode 21 located in the pixel circuit area 101 and a transferring ring 22 located in the transferring area 102 and surrounding the pixel circuit area 101.

The pixel definition layer 3 covers the first electrode layer 2 and the driving backplane 1, and exposes the first electrode 21 and the transferring ring 22.

The light-emitting functional layer 4 is arranged on a surface of the first electrode layer 2 facing away from the driving backplane 1, and an orthographic projection of the light-emitting functional layer 4 on the driving backplane 1 is located in a range surrounded by the transferring area 102.

The second electrode layer 5 covers the pixel definition layer 3 and the light-emitting functional layer 4; the boundary of the second electrode layer 5 is located inside a boundary of the pixel definition layer 3, and the second electrode layer 5 is connected with the transferring ring 22. The second electrode layer 5 has an electrode edge portion 51 which is an annular area extending inward from the boundary of the second electrode layer 5. At least part of the orthographic projection of the electrode edge portion 51 on the driving backplane 1 is located within the transferring area 102, and a thickness of the electrode edge portion 51 decreases towards the boundary of the driving backplane 1.

In the display panel according to an embodiment of the present disclosure, the electrode edge portion 51 of the second electrode layer 5 is a shadow area caused by the shadowing effect of the mask, and at least part of an orthographic projection of the electrode edge portion 51 on the driving backplane 1 is located within the transferring area 102, instead of being located completely within the peripheral area 103, so that the distance between the boundary of the second electrode layer 5 and the boundary of the driving backplane 1 is increased, the invasion path of water vapor and oxygen is extended, and the risk of erosion of the second electrode layer 5 is reduced, thereby prolonging the service life of the display panel.

The components of the display panel of the present disclosure will be described in detail below.

As shown in FIGS. 1 and 2, the driving backplane 1 may include a pixel circuit area 101, a transferring area 102 surrounding outside the pixel circuit area 101, and a peripheral area 103 surrounding outside the transferring area 102. A pixel circuit may be formed in the pixel circuit area 101, and the transferring area 102 and the pixel circuit area 101 may be provided with a driving circuit. The driving circuit may include a gate driving circuit, a light-emitting control circuit, etc. The structures of the pixel circuit and the driving circuit will not be particularly limited herein. A signal may be input to the pixel circuit through the driving circuit, such that a driving signal may be input to the first electrode 21 through the pixel circuit, and at the same time a signal may also be input to the second electrode layer 5 through the driving circuit, thereby driving the light-emitting functional layer 4 to emit light through the first electrode layer 2 and the second electrode layer 5.

In addition, as shown in FIGS. 1 and 2, the driving backplane 1 may further include a transition area 104 separating between the pixel circuit area 101 and the transferring area 102. The transition area 104 surrounds the pixel circuit area 101, and the transferring area 102 surrounds the transition area 104.

In some embodiments of the present disclosure, the driving backplane 1 may include a silicon substrate, and the driving circuit and the pixel circuit may be formed on the silicon substrate by a semiconductor process. For example, each of the driving circuit and the pixel circuit includes a plurality of transistors. An active layer, a first electrode and a second electrode of the transistor may be formed in the silicon substrate by doping process. The active layer of the transistor is inside the silicon substrate. A plurality of conductive layers, etc. are formed at a side of the silicon substrate by sputtering process. There is an insulating layer between two adjacent conductive layers, and the first electrode layer 2 and the transistor may be connected through the plurality of conductive layers. The specific connection lines and wiring patterns depend on the corresponding circuit structure, and will not be particularly limited herein.

The pixel circuit area 101 of the driving backplane 1 may be provided with a plurality of light-emitting devices thereon. The light-emitting device may be an OLED light-emitting device including an anode, a cathode and a light-emitting layer located between the anode and the cathode. An electrical signal may be applied to the anode and the cathode through the driving backplane 1, so as to drive the light-emitting layer to emit light. In an embodiment of the present disclosure, the first electrode layer 2, the pixel definition layer 3, the light-emitting functional layer 4 and the second electrode layer 5 are used to form the above-mentioned light-emitting devices, as shown in FIGS. 1 and 2.

Specifically, the first electrode layer 2 is arranged at a side surface of the driving backplane 1, and includes a first electrode 21 and a transferring ring 22, wherein the first electrode 21 may be provided in plural, and distributed in an array in a range of the pixel circuit area 101, and each of the first electrodes 21 may act as an anode of one light-emitting device.

The transferring ring 22 is located in the range of the transferring area 102, arranged around the pixel circuit area 101, and connected with the driving circuit in the driving backplane 1. The transferring ring 22 may be made of the same material and has the same thickness as the first electrode 21, so that the transferring ring and the first electrode may be formed at the same time by one patterning process. The transferring ring 22 is not limited to a continuous and closed annular structure, but may be formed by annular distribution of electrode blocks with the same shape and size as the first electrode 21, and may be distributed along a plurality of concentrically distributed annular tracks.

In addition, the first electrode layer 2 may further include a dummy electrode 23 located within a range of the transition area 104, and a pattern of the dummy electrode 23 is the same as that of the first electrode 21, so as to ensure the etching uniformity of the first electrode layer 2.

The first electrode layer 2 may have a single-layer or multi-layer structure, and may be made of metal, transparent conductive material, etc., which will not be particularly limited herein. The orthographic projection of the first electrode 21 on the driving backplane 1 may have a shape of regular hexagon or other polygons, and of course, it may also have a shape of circle or ellipse.

The pixel definition layer 3 is arranged on the same side of the driving backplane 1 as the first electrode layer 2, and covers the first electrode layer 2 and the driving backplane 1. Meanwhile, the pixel definition layer 3 has a plurality of openings, and the first electrode 21 and the transferring ring 22 are exposed through the openings. The boundary of the pixel definition layer 3 coincides with the boundary of the driving backplane 1. The pixel definition layer 3 may define the position of each light-emitting device, that is, the position of the exposed first electrode 21.

The light-emitting functional layer 4 is arranged on a surface of the first electrode layer 2 facing away from the driving backplane 1, and an orthographic projection of the light-emitting functional layer 4 on the driving backplane 1 is within a range surrounded by the transferring area 102.

In some embodiments of the present disclosure, as shown in FIG. 1, the light-emitting functional layer 4 may be formed on a surface of the pixel definition layer 3 facing away from the driving backplane 1 and filled in the opening of the pixel definition layer 3, so as to be laminated with the first electrode 21 and act as a light-emitting layer of the light-emitting device; meanwhile, the boundary of the orthographic projection of the light-emitting functional layer 4 on the driving backplane 1 may be within the transition area 104, that is, there is no light-emitting functional layer 4 in an area of the pixel definition layer 3 corresponding to the transferring area 102 and the peripheral area 103. The light-emitting functional layer 4 may include a hole injection layer, a hole transport layer, a light-emitting material layer, an electron transport layer and an electron injection layer which are sequentially laminated in a direction facing away from the driving backplane 1. The light-emitting functional layer 4 may be a continuous film layer arranged in the whole layer, and may emit monochromatic light such as blue light or white light under the action of electrical signals, that is, each light-emitting device has the same light-emitting color.

Of course, in other embodiments of the present disclosure, the light-emitting functional layer 4 may also be evaporated in the openings of the pixel definition layer 3 where the first electrodes 21 are exposed by using a fine mask, and the light-emitting colors of the light-emitting functional layer 4 in different openings may be different.

The second electrode layer 5 covers the pixel definition layer 3 and the light-emitting functional layer 4, and may act as the cathode of the light-emitting device to drive the light-emitting functional layer 4 to emit light in cooperation with the first electrode layer 2.

Figure 9:
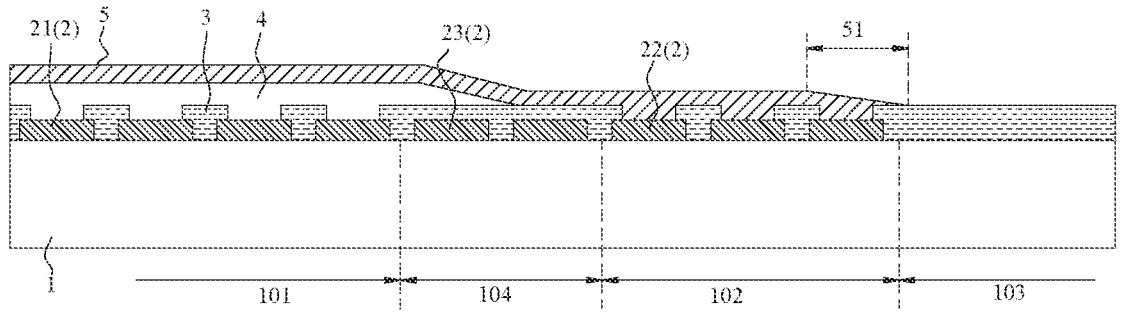
FIG. 9 is a schematic view of step S150 in the fabrication method according to an embodiment of the present disclosure.

As shown in FIGS. 1 and 9, the boundary of the second electrode layer 5 is located inside the boundary of the pixel definition layer 3, and the orthographic projection of the second electrode layer 5 on the driving backplane 1 at least covers the pixel circuit area 101, the transition area 104 and the transferring area 102. Of course, the orthographic projection may extend into the peripheral area 103. The second electrode layer 5 is connected with the transferring ring 22 through the opening of the pixel definition layer 3 exposing the transferring ring 22, so that the second electrode layer 5 may be connected with the driving circuit through the transferring ring 22 to input a signal to the second electrode layer 5.

The second electrode layer 5 has an electrode edge portion 51, which is an annular area extending inward from the boundary of the second electrode layer 5. The thickness of the electrode edge portion 51 decreases towards the boundary of the pixel definition layer 3, and the electrode edge portion 51 is a shadow area formed by the shadowing effect of the mask. Since the boundary of the pixel definition layer 3 coincides with the boundary of the driving backplane 1, the thickness of the electrode edge portion 51 actually decreases towards the boundary of the driving backplane 1. At least part of the orthographic projection of the electrode edge portion 51 on the driving backplane 1 is within the transferring area 102, but is no longer completely within the peripheral area 103, so that the distance between the boundary of the second electrode layer 5 and the boundary of the driving backplane 1 is increased, facilitating to prevent external water vapor and oxygen from eroding the second electrode layer 5. Of course, the boundary of the orthographic projection of the electrode edge portion 51 on the driving backplane 1 may be within the transferring area 102 or may coincide with the outer boundary of the transferring area 102.

In addition, a structure of a light transmitting area of the mask may be adjusted, so that the boundary of the electrode edge portion 51 can be contracted inward as described above, and the erosion path can be extended.

The second electrode layer 5 may have a single-layer or multi-layer structure, and its material may include one or more of metal, metal oxide and transparent conductive material.

Figure 10:
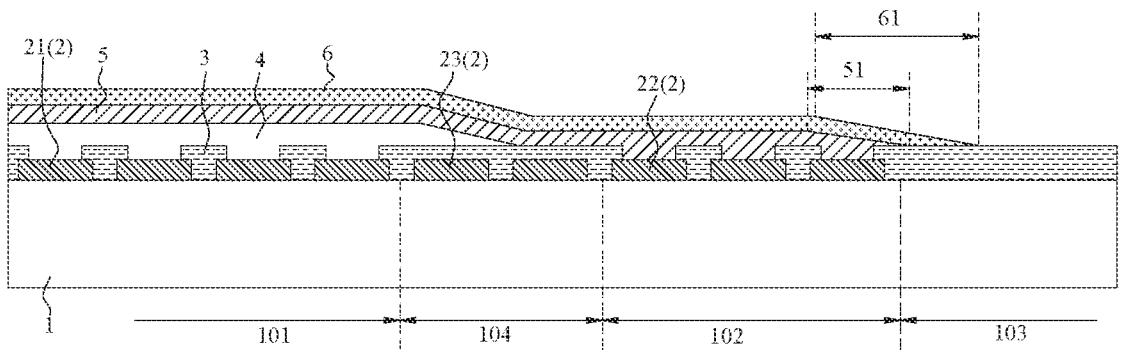
FIG. 10 is a schematic view of step S160 in the fabrication method according to an embodiment of the present disclosure.
Figure 11:
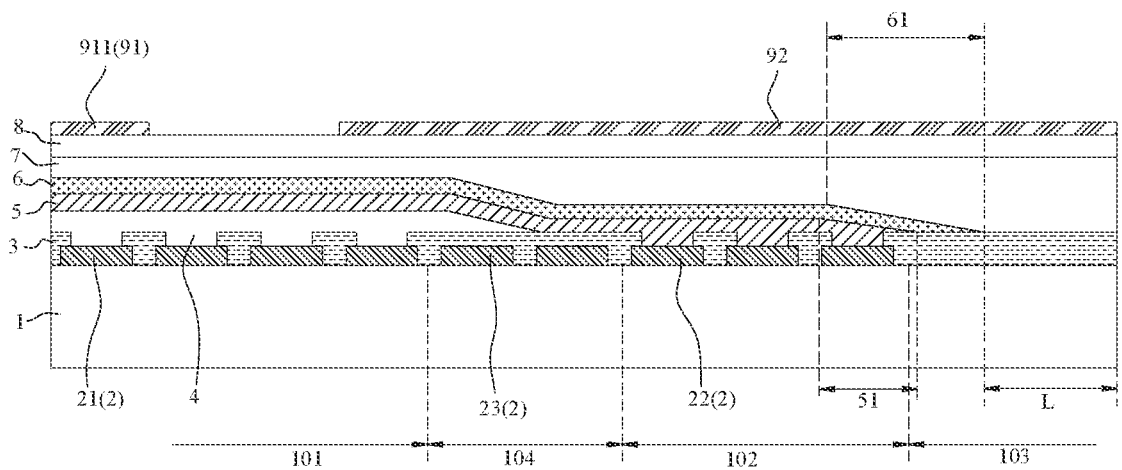
FIG. 11 is a schematic view of step S1710 in the fabrication method according to an embodiment of the present disclosure.
Figure 12:
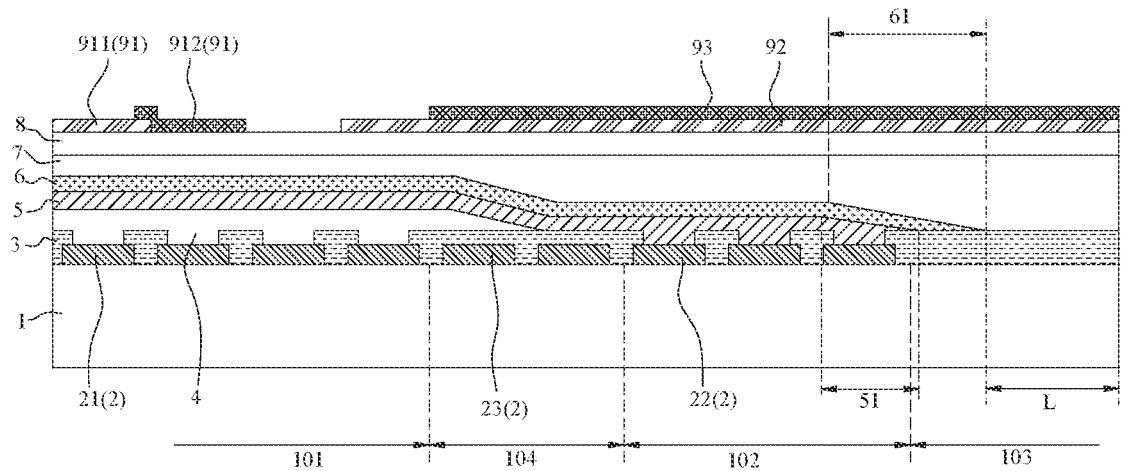
FIG. 12 is a schematic view of step S1720 in the fabrication method according to an embodiment of the present disclosure.
Figure 13:
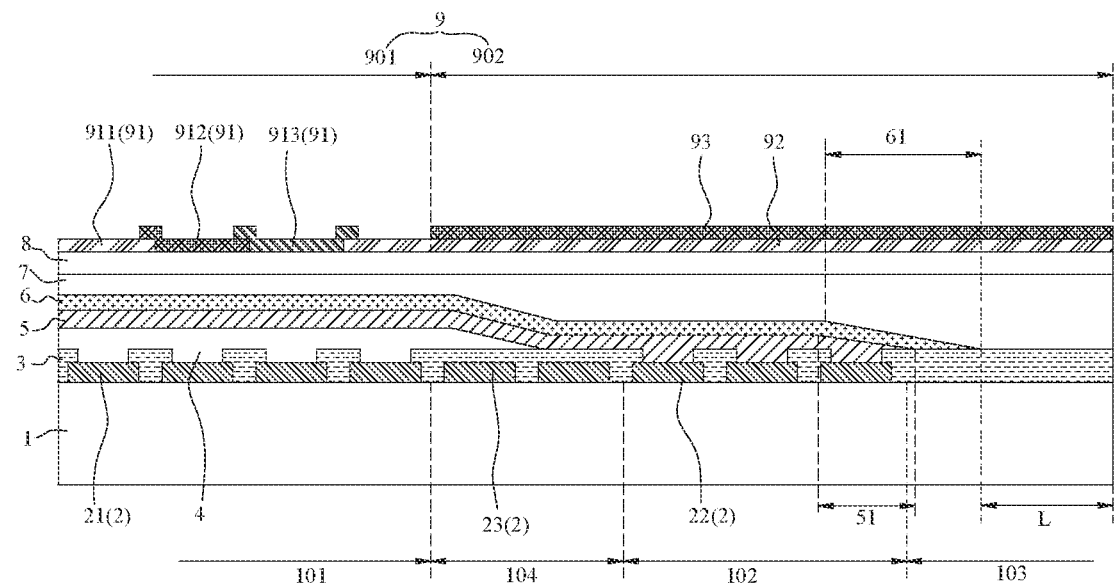
FIG. 13 is a schematic view of step S170 in the fabrication method according to an embodiment of the present disclosure.

As shown in FIGS. 1 and 10, the display panel of the present disclosure may further include a light extraction layer 6. The light extraction layer 6 covers the second electrode layer 5 and is shape-conformably attached to the second electrode layer 5, so as to form an extraction edge portion 61 at an area corresponding to the electrode edge portion 51, that is, the extraction edge portion 61 is an annular area extending inward from the boundary of the light extraction layer 6, and the extraction edge portion 61 covers the electrode edge portion 51. Meanwhile, the boundary of the light extraction layer 6 is inside the boundary of the pixel definition layer 3, and the light extraction layer 6 exposes a part of the pixel definition layer 3. An orthographic projection of the extraction edge portion 61 on the driving backplane 1 is at least partially within the transferring area 102.

As shown in FIG. 1, similar to the electrode edge portion 51, the extraction edge portion 61 is also a shadow area formed by the shadowing effect of the mask. Since the orthographic projection of the extraction edge portion on the driving backplane 1 is at least partially within the transferring area 102, and completely within the peripheral area 103, a distance between a boundary of the light extraction layer 6 and the boundary of the driving backplane 1 is increased, facilitating to prevent the external water vapor and oxygen from eroding the light extraction layer 6 and prevent the light extraction layer 6 from being damaged by film explosion, etc. For example, the distance L between the boundary of the light extraction layer 6 and the boundary of the pixel definition layer 3 is not less than 300 µm, such as 300 µm, 330 µm, 350 µm, 400 µm, etc., so that it is larger than 100 µm in the related art.

Furthermore, as shown in FIG. 1, the orthographic projection of the transferring ring 22 on the driving backplane 1 may at least partially overlap with the orthographic projection of the electrode edge portion 51 on the driving backplane 1, that is, at least part of the shadow area of the second electrode layer 5 may be connected with the transferring layer 22. Accordingly, the orthographic projection of the transferring ring 22 on the driving backplane 1 at least partially overlaps with the orthographic projection of the extraction edge portion 61 on the driving backplane 1.

Furthermore, as shown in FIG. 1, the display panel may further include a first packaging layer 7, and the first packaging layer may cover the light extraction layer 6 and the pixel definition layer 3 that is not covered by the light extraction layer 6. Exemplarily, two inorganic layers and an organic layer coated between the two inorganic layers may be adopted in the first packaging layer 7. Of course, the first packaging layer 7 may also have other structures, which will not be particularly limited herein. The light-emitting device may be protected by the first packaging layer 7.

In addition, in order to eliminate a height difference and realize planarization, the surface of the first packaging layer 7 facing away from the driving backplane 1 may be covered by a planarization layer 8.

Based on the display panel of the above embodiments, in order to realize full-color display in cooperation with the light-emitting functional layer 4 emitting white light or monochromatic light, in some embodiments of this disclosure, as shown in FIG. 1, the display panel may further include a color film layer 9, and the color film layer 9 is arranged at a side of the light extraction layer 6 facing away from the driving backplane 1. For example, the color film layer 9 is arranged on a surface of the planarization layer 8 facing away from the driving backplane 1.

The color film layer 9 includes a pixel area 901 and an edge area 902 surrounding the pixel area 901.

An orthographic projection of the pixel area 901 on the driving backplane 1 is within the pixel circuit area 101, and the pixel area 901 may include a plurality of filter portions 91, adjacent filter portions 91 are arranged at intervals, and the filter portions 91 are arranged corresponding to the first electrodes 21 one by one. Each of the filter portions 91 may only transmit monochromatic light.

In some embodiments of the present disclosure, as shown in FIG. 1, each of the filter portions 91 includes a first filter portion 911, a second filter portion 912 and a third filter portion 913, wherein the first filter portion 911 may transmit light of a first color, the second filter portion 912 may transmit light of a second color, and the third filter portion 913 may transmit light of a third color. The first color, the second color, and the third color are different from each other. For example, the first color is red, the second color is blue, and the third color is green.

There is a light shielding structure between two adjacent filter portions 91, and the light shielding structure may be made of light shielding material. Alternatively, as shown in FIGS. 1 and 11-13, light transmission colors of any two adjacent filter portions 91 may be different, the adjacent filter portions 91 extend towards each other, and their extension areas are laminated in a direction perpendicular to the driving backplane 1, so that light shielding can be realized through the laminated extension areas.

As shown in FIG. 1, the orthographic projection of the edge area 902 on the driving backplane 1 covers the transferring area 102 and extends into the peripheral area 103. For example, the boundary of the color film layer 9 is aligned with the boundary of the driving backplane 1, that is, the boundary of the orthographic projection of the color film layer 9 on the driving backplane 1 coincides with the boundary of the driving backplane 1. The edge area 902 is a light shielding structure for blocking the light reflection of the driving circuit and the transferring ring 22. Meanwhile, if the edge of the first packaging layer 7 is damaged due to particles or process defects, the color film layer 9 may shield in the direction perpendicular to the driving backplane 1, thereby preventing water vapor and oxygen from invading in the direction perpendicular to the driving backplane 1.

In some embodiments of the present disclosure, as shown in FIG. 1, the light shielding may be realized by a plurality of filter layers in the edge area 902, and each filter layer may only transmit light of one color. For example, the edge area 902 of the color film layer 9 may include a first filter layer 92 and a second filter layer 93 which are sequentially laminated along the direction facing away from the driving backplane 1. The first filter layer 92 may transmit light of a first color and the second filter layer 93 may transmit light of a second color. Since the first color and the second color are different, the edge area 902 cannot transmit light of any color, thus obtaining a light shielding structure. The blue filter layer and the red filter layer have strong filtering effect on light and, therefore, the first color may be red and the second color may be blue.

Of course, in other embodiments of the present disclosure, the edge area 902 may also have three or more layers, or a single layer of black shading material may be used.

Further, the thickness of the edge area 902 may be greater than the thickness of the pixel area 901, that is, greater than the thickness of the filter portion 91. As shown in FIG. 1, in order to simplify the process, the first filter layer 92 and the first filter portion 911 with the same color may be simultaneously formed by the same one evaporation process, and both of the first filter layer and the first filter portion are located on the surface of the planarization layer 8 facing away from the driving backplane 1. Meanwhile, the second filter layer 93 and the second filter portion 912 with the same color are simultaneously formed by the same one evaporation process, the second filter layer 93 may be located on the surface of the first filter layer 92 facing away from the driving backplane 1, and the second filter portion 912 may be located on the surface of the planarization layer 8 facing away from the driving backplane 1.

In some embodiments of the present disclosure, as shown in FIG. 1, the display panel of the embodiment of the present disclosure may further include a second packaging layer 10. The second packaging layer may cover the color film layer 9, and a structure of the second packaging layer 10 may be same as that of the first packaging layer 7, so as to add a package for the display panel and improve the packaging effect.

In some embodiments of the present disclosure, as shown in FIG. 1, the display panel of the embodiment of the present disclosure may further include a transparent cover plate 11, which may be provided at a side of the color film layer 9 facing away from the driving backplane 1, for example, on the surface of the second packaging layer 10 facing away from the driving backplane 1. The transparent cover plate 11 may be made of glass, and a specific type of glass will not be particularly limited herein, as long as it is transparent.

The boundary of the orthographic projection of the transparent cover plate 11 on the driving backplane 1 coincides with the boundary of the driving backplane 1, thus being protected in the direction perpendicular to the driving backplane 1. Meanwhile, in order not to affect the alignment of mask, alignment marks may be provided in a motherboard of display panel, specifically, the motherboard of display panel includes a plurality of display panels and cutting areas for separating the display panels, wherein after cutting along the cutting areas, the plurality of display panels are obtained, and the alignment marks may be provided in the cutting areas. After cutting, the alignment marks are cut off, so that the cut display panels may have no alignment marks, so that the boundary of the transparent cover plate 11 may be aligned with the boundary of the driving backplane 1 without avoiding the alignment marks.

Figure 3:
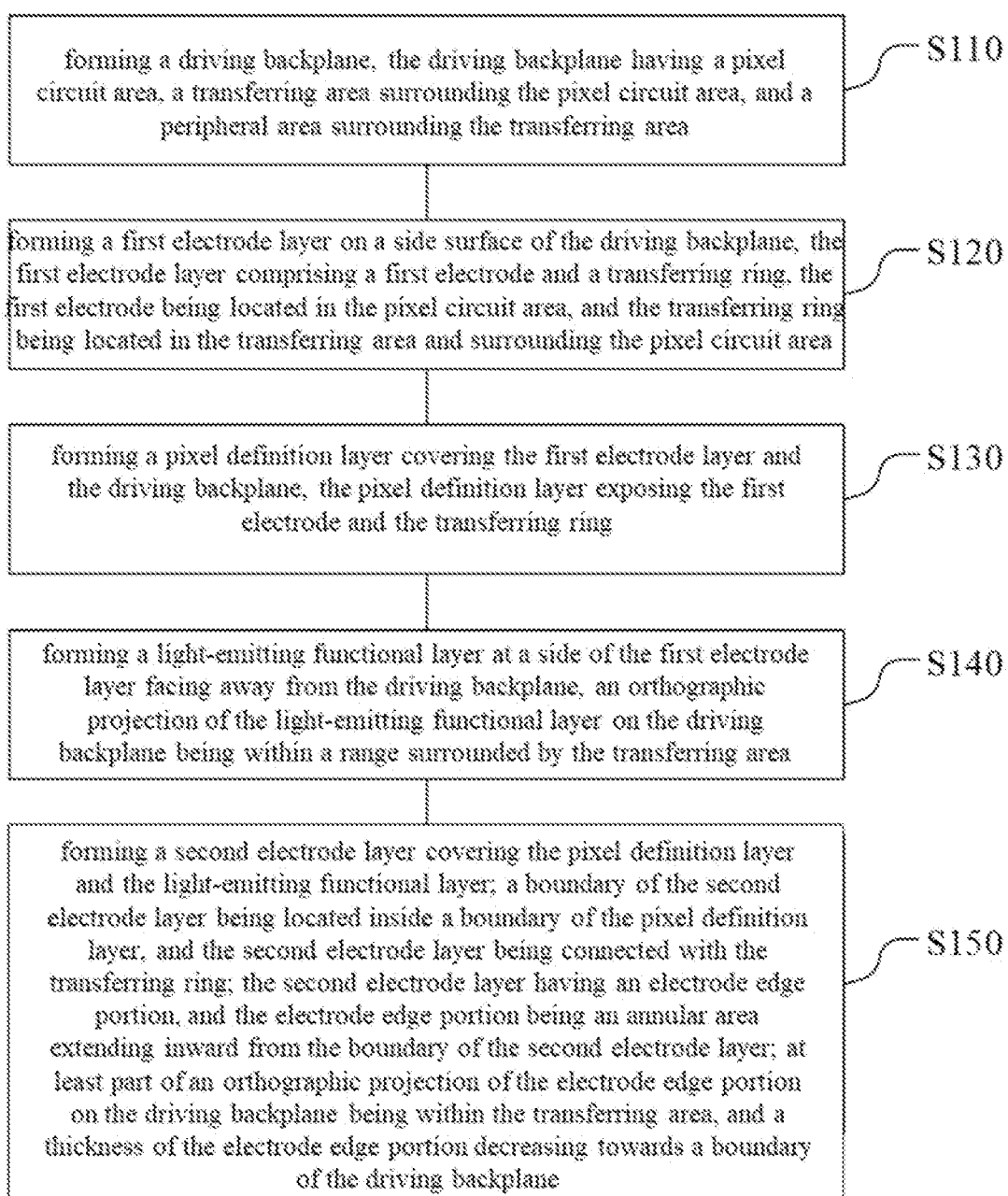
FIG. 3 is a flowchart of a fabrication method according to an embodiment of the present disclosure.

An embodiment of the present disclosure provides a fabrication method of a display panel, and the display panel may be a display panel according to any of the above embodiments, and will not be described in detail herein. As shown in FIGS. 1 and 3, the fabrication method of the present disclosure may include steps S110 to S150, wherein:

S110, forming a driving backplane having a pixel circuit area, a transferring area surrounding the pixel circuit area and a peripheral area surrounding the transferring area;

S120, forming a first electrode layer on a side surface of the driving backplane, wherein the first electrode layer includes a first electrode located in the pixel circuit area and a transferring ring located in the transferring area and surrounding the pixel circuit area;

S130, forming a pixel definition layer covering the first electrode layer and the driving backplane, wherein the pixel definition layer exposes the first electrode and the transferring ring;

S140, forming a light-emitting functional layer at a side of the first electrode layer facing away from the driving backplane, wherein an orthographic projection of the light-emitting functional layer on the driving backplane is within a range surrounded by the transferring area;

S150, forming a second electrode layer covering the pixel definition layer and the light-emitting functional layer; a boundary of the second electrode layer is located inside a boundary of the pixel definition layer, and the second electrode layer is connected with the transferring ring; the second electrode layer has an electrode edge portion, and the electrode edge portion is an annular area extending inward from the boundary of the second electrode layer; at least part of an orthographic projection of the electrode edge portion on the driving backplane is within the transferring area, and a thickness of the electrode edge portion decreases towards the boundary of the driving backplane.

Figure 4:
FIG. 4 is a flowchart of a fabrication method according to an embodiment of the present disclosure.

In some embodiments of the present disclosure, as shown in FIGS. 1 and 4, the fabrication method of the present disclosure may further include step S160, wherein:

S160, forming a light extraction layer covering the second electrode layer, wherein a boundary of the light extraction layer is located inside the boundary of the pixel definition layer; the light extraction layer has an extraction edge portion covering the electrode edge portion, and the extraction edge portion is an annular area extending inward from the boundary of the light extraction layer; an orthographic projection of the extraction edge portion on the driving backplane is at least partially within the transferring area.

Figure 5:
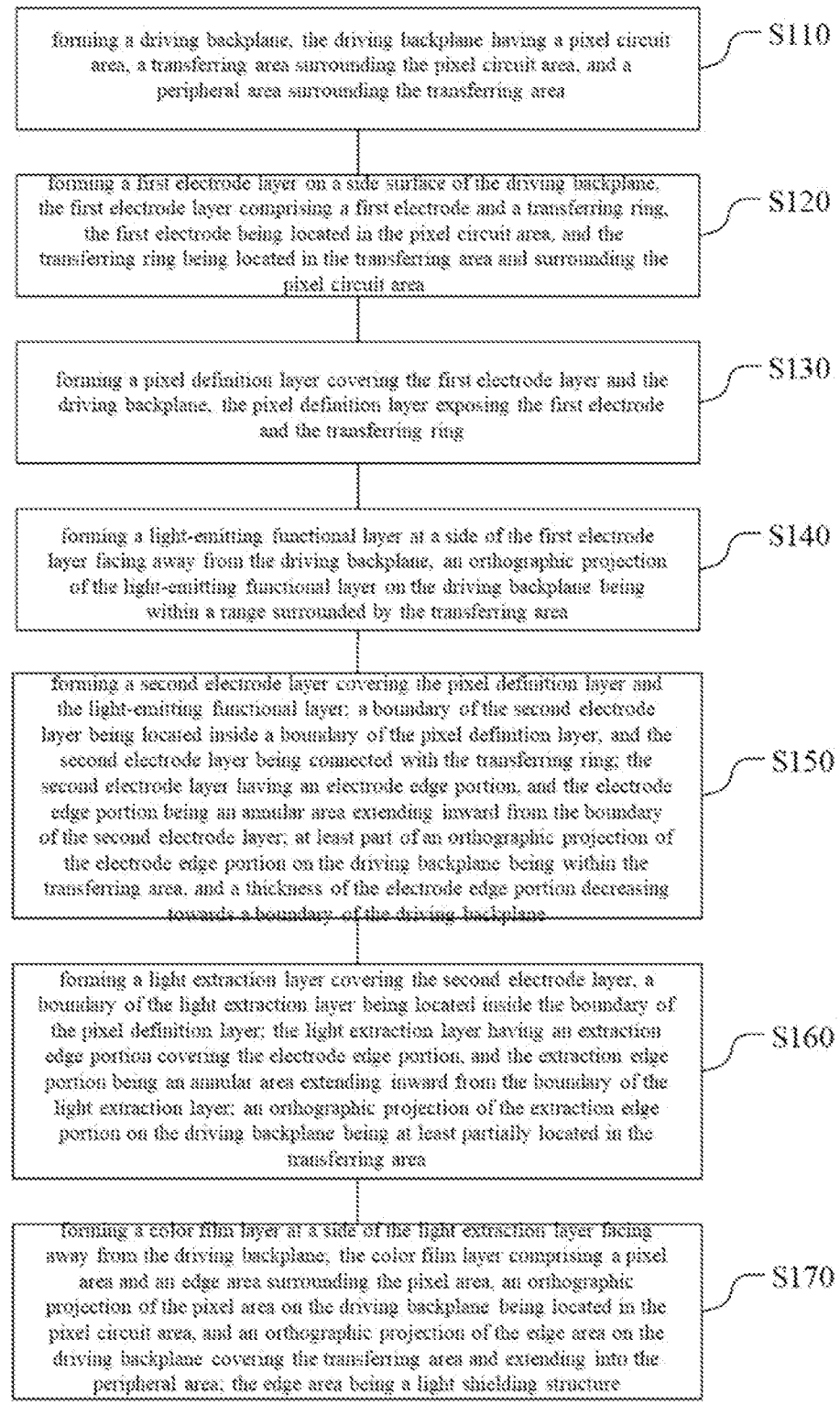
FIG. 5 is a flowchart of a fabrication method according to an embodiment of the present disclosure.

In some embodiments of the present disclosure, as shown in FIGS. 1 and 5, the fabrication method of the present disclosure further includes step S170, wherein:

S170, forming a color film layer at a side of the light extraction layer facing away from the driving backplane, wherein the color film layer includes a pixel area and an edge area surrounding the pixel area, an orthographic projection of the pixel area on the driving backplane is within the pixel circuit area, and an orthographic projection of the edge area on the driving backplane covers the transferring area and extends into the peripheral area; the edge area is a light shielding structure.

Figure 6:
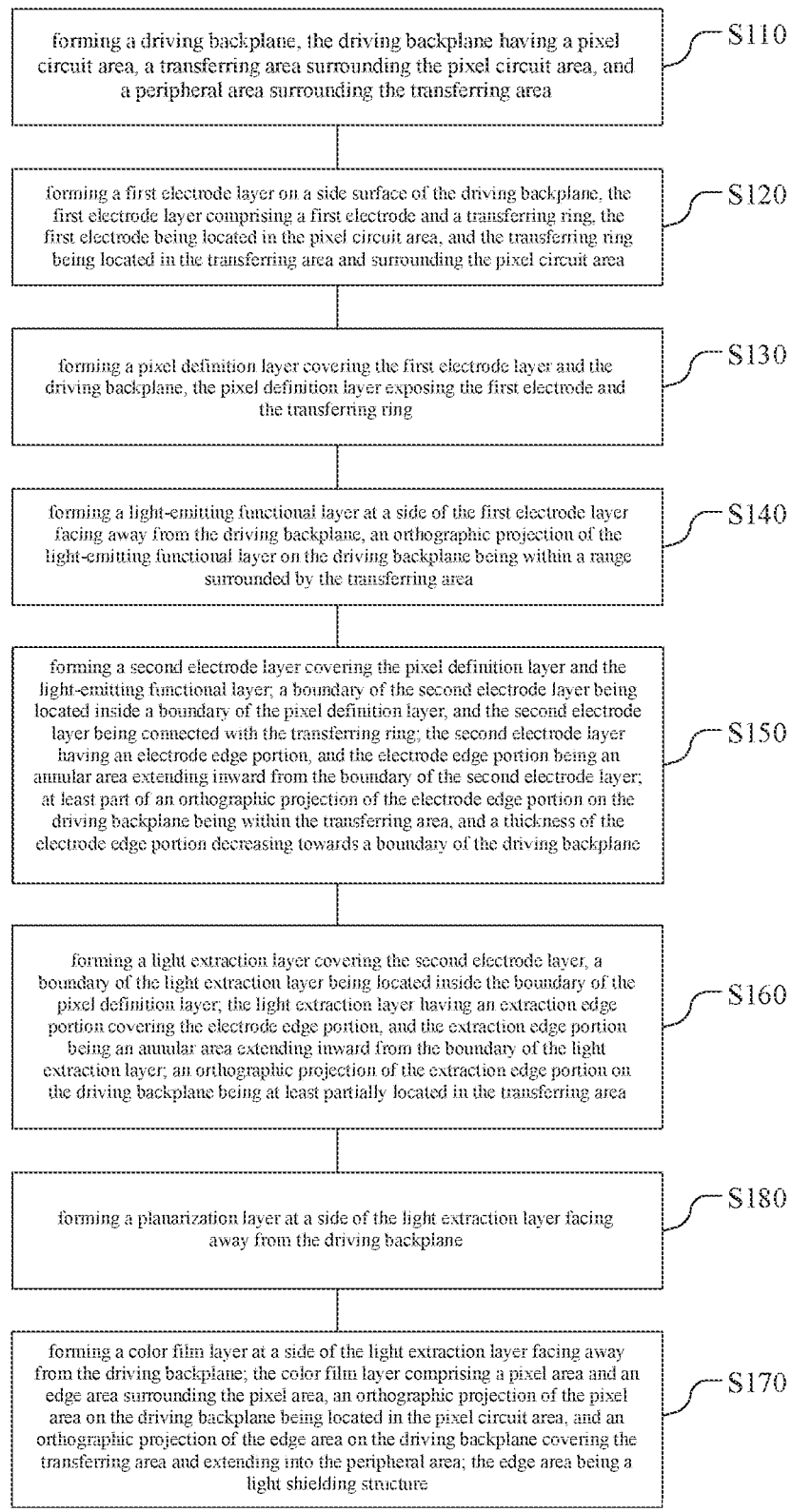
FIG. 6 is a flowchart of a fabrication method according to an embodiment of the present disclosure.

In some embodiments of the present disclosure, after forming the light extraction layer and before forming the color film layer, that is, after step S160 and before step S170, as shown in FIG. 6, the fabrication method of the present disclosure further includes step S180, wherein:

S180, forming a planarization layer at a side of the light extraction layer facing away from the driving backplane.

As shown in FIGS. 7, 11-13, forming a color film layer at a side of the light extraction layer facing away from the driving backplane, i.e., step S170 may include step S1710 and step S1720, wherein:

S1710, forming a first filter material layer capable of transmitting light of a first color on a surface of the planarization layer facing away from the driving backplane; wherein the first filter material layer includes a first filter portion and a first filter layer; an orthographic projection of the first filter portion on the driving backplane is within the pixel circuit area, and an orthographic projection of the first filter layer on the driving backplane covers the transferring area and extends into the peripheral area;

S1720, forming a second filter material layer capable of transmitting light of a second color on the surface of the planarization layer facing away from the driving backplane and on the surface of the first filter layer facing away from the driving backplane; wherein the second filter material layer includes a second filter portion and a second filter layer, an orthographic projection of the second filter portion on the driving backplane is within the pixel circuit area; the second filter layer is arranged on the surface of the first filter layer facing away from the driving backplane; and an orthographic projection of the second filter layer on the driving backplane covers the transferring area and extends into the peripheral area.

The first color and the second color are different.

Figure 8:
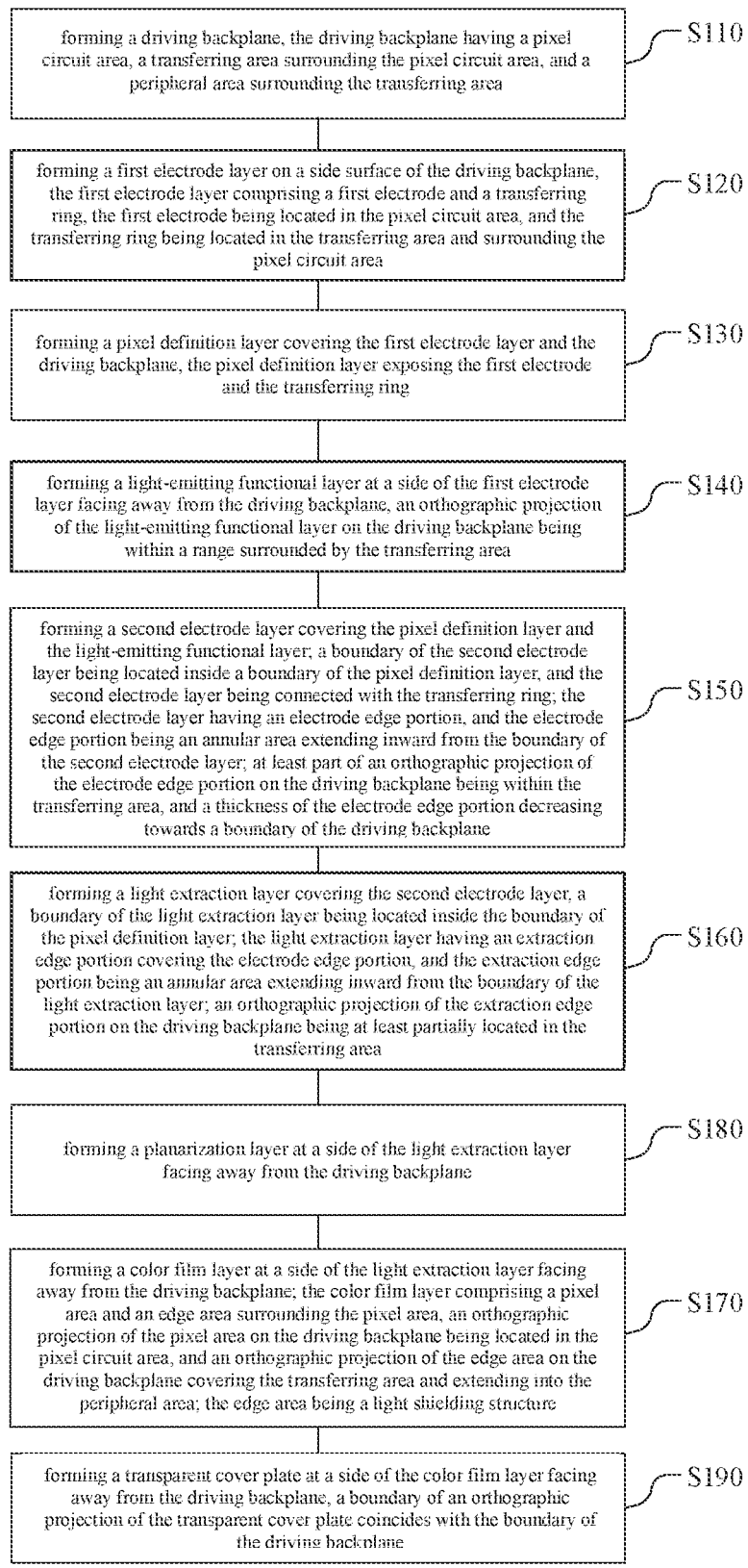
FIG. 8 is a flowchart of a fabrication method according to an embodiment of the present disclosure.

In some embodiments of the present disclosure, as shown in FIGS. 1 and 8, the fabrication method of the present disclosure further includes step S190, wherein:

S190, forming a transparent cover plate at a side of the color film layer facing away from the driving backplane, wherein a boundary of an orthographic projection of the transparent cover plate on the driving backplane coincides with the boundary of the driving backplane.

The details of parts of the display panel manufactured by the fabrication method of the present disclosure and the beneficial effects of the display panel have been described in detail in the above embodiments of the display panel, and reference can be made to the embodiments of the display panel, which will not be described in detail herein.

It should be noted that, although the various steps of the method of the present disclosure are described in a particular order in the figures, it is not required or implied that the steps must be performed in the particular order, or all the illustrated steps must be performed to achieve the desired result.

Additionally or alternatively, some steps may be omitted, or multiple steps may be combined into one step to be performed, and/or one step is decomposed into multiple steps to be performed.

The present disclosure also provides a display device, and the display device may include the display panel according to any of the above embodiments. The structure of the display panel has been described in detail in the above embodiments of the display panel, and it will not be repeated herein. Meanwhile, since the display panel used in the display device of the present disclosure has the same implementation, and thus has the same beneficial effect as that of the display panel in the above embodiments.

The display device of the present disclosure may be an electronic device with an image display function, such as a mobile phone, a tablet computer, a television, etc., which will not be listed herein.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

What is claimed is:

1. A display panel, comprising:
    a driving backplane having a pixel circuit area, a transferring area surrounding the pixel circuit area, and a peripheral area surrounding the transferring area;
    a first electrode layer arranged on a side surface of the driving backplane and comprising a first electrode and a transferring ring, the first electrode being located in the pixel circuit area, and the transferring ring being located in the transferring area and surrounding the pixel circuit area;
    a pixel definition layer covering the first electrode layer and the driving backplane, and exposing the first electrode and the transferring ring;
    a light-emitting functional layer arranged on a surface of the first electrode layer facing away from the driving backplane, an orthographic projection of the light-emitting functional layer on the driving backplane being within a range surrounded by the transferring area; and
    a second electrode layer covering the pixel definition layer and the light-emitting functional layer, a boundary of the second electrode layer being located inside a boundary of the pixel definition layer, the second electrode layer being connected with the transferring ring, the second electrode layer having an electrode edge portion, and the electrode edge portion being an annular area extending inward from the boundary of the second electrode layer wherein:
    at least part of an orthographic projection of the electrode edge portion on the driving backplane is within the transferring area, and a thickness of the electrode edge portion decreases gradually towards a boundary of the driving backplane, and
    the display panel further comprises:
        a light extraction layer covering the second electrode layer, an end boundary of the light extraction layer where the light extraction layer ceases to exist being located inside an end boundary of the pixel definition layer where the pixel definition layer ceases to exist, the light extraction layer having an extraction edge portion covering the electrode edge portion, the extraction edge portion being an annular area extending inward from the boundary of the light extraction layer, and an orthographic projection of the extraction edge portion on the driving backplane being at least partially within the transferring area; and
        a color film layer arranged at a side of the light extraction layer facing away from the driving backplane, the color film layer comprising a pixel area and an edge area surrounding the pixel area, an orthographic projection of the pixel area on the driving backplane being within the pixel circuit area, an orthographic projection of the edge area on the driving backplane covering the transferring area and extends into the peripheral area, an end boundary of the edge area where the edge area ceases to exist is aligned with an end boundary of the driving backplane where the driving backplane ceases to exist and the edge area being a light shielding structure.

2. The display panel according to claim 1, wherein:
    an orthographic projection of the transferring ring on the driving backplane at least partially coincides with the orthographic projection of the electrode edge portion on the driving backplane; and
    the orthographic projection of the transferring ring on the driving backplane at least partially coincides with the orthographic projection of the extraction edge portion on the driving backplane.

3. The display panel according to claim 1, wherein a distance between the boundary of the light extraction layer and the boundary of the pixel definition layer is not less than 300 μm.

4. The display panel according to claim 1, wherein:
    the edge area comprises a first filter layer and a second filter layer which are sequentially laminated in a direction facing away from the driving backplane, the first filter layer is capable of transmitting light of a first color, and the second filter layer is capable of transmitting light of a second color;
    the first color and the second color are different.

5. The display panel according to claim 1, wherein a thickness of the edge area is greater than a thickness of the pixel area.

6. The display panel according to claim 4, wherein the first color is red and the second color is blue.

7. The display panel according to claim 1, wherein the display panel further comprises a transparent cover plate arranged at a side of the color film layer facing away from the driving backplane, and a boundary of an orthographic projection of the transparent cover plate on the driving backplane coincides with the boundary of the driving backplane.

8. A fabrication method of a display panel, comprising:
    forming a driving backplane, the driving backplane having a pixel circuit area, a transferring area surrounding the pixel circuit area, and a peripheral area surrounding the transferring area;
    forming a first electrode layer on a side surface of the driving backplane, the first electrode layer comprising a first electrode and a transferring ring, the first electrode being located in the pixel circuit area, and the transferring ring being located in the transferring area and surrounding the pixel circuit area;

forming a pixel definition layer covering the first electrode layer and the driving backplane, the pixel definition layer exposing the first electrode and the transferring ring;
forming a light-emitting functional layer at a side of the first electrode layer facing away from the driving backplane, an orthographic projection of the light-emitting functional layer on the driving backplane being within a range surrounded by the transferring area;
forming a second electrode layer covering the pixel definition layer and the light-emitting functional layer; a boundary of the second electrode layer being located inside a boundary of the pixel definition layer, and the second electrode layer being connected with the transferring ring; the second electrode layer having an electrode edge portion, and the electrode edge portion being an annular area extending inward from the boundary of the second electrode layer; at least part of an orthographic projection of the electrode edge portion on the driving backplane being within the transferring area, and a thickness of the electrode edge portion decreasing gradually towards a boundary of the driving backplane;
forming a light extraction layer covering the second electrode layer, an end boundary of the light extraction layer where the light extraction layer ceases to exist being located inside an end boundary of the pixel definition layer where the pixel definition layer ceases to exist, the light extraction layer having an extraction edge portion covering the electrode edge portion, the extraction edge portion being an annular area extending inward from the boundary of the light extraction layer, and an orthographic projection of the extraction edge portion on the driving backplane being at least partially located in the transferring area; and
forming a color film layer at a side of the light extraction layer facing away from the driving backplane, the color film layer comprising a pixel area and an edge area surrounding the pixel area, an orthographic projection of the pixel area on the driving backplane being located in the pixel circuit area, an orthographic projection of the edge area on the driving backplane covering the transferring area and extending into the peripheral area, an end boundary of the edge area where the edge area ceases to exist is aligned with an end boundary of the driving backplane where the driving backplane ceases to exist and the edge area being a light shielding structure.

9. The fabrication method according to claim 8, wherein after forming the light extraction layer and before forming the color film layer, the fabrication method further comprises:
forming a planarization layer at a side of the light extraction layer facing away from the driving backplane;
forming a color film layer at a side of the light extraction layer facing away from the driving backplane, comprising:
forming a first filter material layer capable of transmitting light of a first color on a surface of the planarization layer facing away from the driving backplane; the first filter material layer comprising a first filter portion and a first filter layer; an orthographic projection of the first filter portion on the driving backplane being within the pixel circuit area, and an orthographic projection of the first filter layer on the driving backplane covering the transferring area and extending into the peripheral area;
forming a second filter material layer capable of transmitting light of a second color on the surface of the planarization layer facing away from the driving backplane and on a surface of the first filter layer facing away from the driving backplane; the second filter material layer comprising a second filter portion and a second filter layer, an orthographic projection of the second filter portion on the driving backplane being within the pixel circuit area, the second filter layer being arranged on the surface of the first filter layer facing away from the driving backplane, and an orthographic projection of the second filter layer on the driving backplane covering the transferring area and extending into the peripheral area; and
the first color and the second color being different.

10. The fabrication method according to claim 8, wherein the fabrication method further comprises forming a transparent cover plate at a side of the color film layer facing away from the driving backplane, wherein a boundary of an orthographic projection of the transparent cover plate coincides with the boundary of the driving backplane.

11. A display device comprising a display panel, the display panel comprising:
a driving backplane having a pixel circuit area, a transferring area surrounding the pixel circuit area, and a peripheral area surrounding the transferring area;
a first electrode layer arranged on a side surface of the driving backplane and comprising a first electrode and a transferring ring, the first electrode being located in the pixel circuit area, and the transferring ring being located in the transferring area and surrounding the pixel circuit area;
a pixel definition layer covering the first electrode layer and the driving backplane, and exposing the first electrode and the transferring ring;
a light-emitting functional layer arranged on a surface of the first electrode layer facing away from the driving backplane, an orthographic projection of the light-emitting functional layer on the driving backplane being within a range surrounded by the transferring area; and
a second electrode layer covering the pixel definition layer and the light-emitting functional layer, a boundary of the second electrode layer being located inside a boundary of the pixel definition layer, the second electrode layer being connected with the transferring ring, the second electrode layer having an electrode edge portion, and the electrode edge portion being an annular area extending inward from the boundary of the second electrode layer, wherein:
at least part of an orthographic projection of the electrode edge portion on the driving backplane is within the transferring area, and a thickness of the electrode edge portion decreases gradually towards a boundary of the driving backplane, and the display panel further comprises:
a light extraction layer covering the second electrode layer, an end boundary of the light extraction layer where the light extraction layer ceases to exist being located inside an end boundary of the pixel definition layer where the pixel definition layer ceases to exist, the light extraction layer having an extraction edge portion covering the electrode edge portion, the extraction edge portion being an annular area extending inward from the boundary of the light extraction layer, and an orthographic projection of the extraction edge portion on the driving backplane being at least partially within the transferring area; and a color film layer arranged at a side of the light extraction layer facing away from the driving backplane, the color film layer comprising a pixel area and an edge area surrounding the pixel area, an orthographic projection of the pixel area on the driving backplane being within the pixel circuit area, an orthographic projection of the edge area on the driving backplane covering the transferring area and extends into the peripheral area, an end boundary of the edge area where the edge area ceases to exist is aligned with an end boundary of the driving backplane where the driving backplane ceases to exist and the edge area being a light shielding structure.

12. The display device according to claim 11, wherein:

an orthographic projection of the transferring ring on the driving backplane at least partially coincides with the orthographic projection of the electrode edge portion on the driving backplane; and the orthographic projection of the transferring ring on the driving backplane at least partially coincides with the orthographic projection of the extraction edge portion on the driving backplane.

13. The display device according to claim 12, wherein a distance between the boundary of the light extraction layer and the boundary of the pixel definition layer is not less than 300 μm.

14. The display device according to claim 11, wherein:

the edge area comprises a first filter layer and a second filter layer which are sequentially laminated in a direction facing away from the driving backplane, the first filter layer is capable of transmitting light of a first color, and the second filter layer is capable of transmitting light of a second color;

the first color and the second color are different.

15. The display device according to claim 11, wherein a thickness of the edge area is greater than a thickness of the pixel area.

16. The display device according to claim 14, wherein the first color is red and the second color is blue.

17. The display device according to claim 11, wherein the display panel further comprises a transparent cover plate arranged at a side of the color film layer facing away from the driving backplane, and a boundary of an orthographic projection of the transparent cover plate on the driving backplane coincides with the boundary of the driving backplane.

\* \* \* \* \*